(12) United States Patent
Lin

(10) Patent No.: US 7,440,284 B1
(45) Date of Patent: Oct. 21, 2008

(54) HOLDING DEVICE FOR A HEAT SINK

(75) Inventor: Hsin-Cheng Lin, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 0 days.

(21) Appl. No.: 11/744,817

(22) Filed: May 4, 2007

(51) Int. Cl.
H05K 7/20 (2006.01)
F28F 7/00 (2006.01)
H01L 23/34 (2006.01)

(52) U.S. Cl. .............. 361/719; 165/80.3; 165/185; 257/718; 257/719; 361/704; 361/710

(58) Field of Classification Search ......... 257/718–719; 361/719
See application file for complete search history.

(56) References Cited

U.S. PATENT DOCUMENTS

| | | | | |
|---|---|---|---|---|
| 4,605,058 A * | 8/1986 | Wilens | ...... | 165/80.2 |
| 4,625,260 A * | 11/1986 | Jordan et al. | ...... | 361/720 |
| 5,367,433 A * | 11/1994 | Blomquist | ...... | 361/704 |
| 6,504,712 B2 * | 1/2003 | Hashimoto et al. | ...... | 361/687 |
| 6,947,284 B2 * | 9/2005 | Liu | ...... | 361/704 |
| 7,126,823 B2 * | 10/2006 | Chen et al. | ...... | 361/702 |
| 7,142,422 B2 * | 11/2006 | Lee et al. | ...... | 361/695 |
| 7,269,013 B2 * | 9/2007 | Chen et al. | ...... | 361/700 |
| 7,283,368 B2 * | 10/2007 | Wung et al. | ...... | 361/719 |
| 7,333,333 B2 * | 2/2008 | Zhao et al. | ...... | 361/700 |
| 7,350,299 B2 * | 4/2008 | Renfro et al. | ...... | 29/874 |
| 2007/0091576 A1 * | 4/2007 | Wung et al. | ...... | 361/719 |
| 2008/0062653 A1 * | 3/2008 | Li | ...... | 361/719 |

* cited by examiner

Primary Examiner—Gregory D Thompson

(57) ABSTRACT

A holding device for a heat sink being attached to a circuit board includes a back plate and a frame member. The back plate provides a plurality of fixing posts with a free end of the respective fixing post having a neck recess piecing the circuit board and each of the fixing posts being surrounded with a spring. The frame member provides a plurality of corners with a support leg vertically extending from the corners respectively and a first flat fixing ear horizontally extending outward from the corners. The first fixing ear has a first elongated hole with a first end part for being pierced by the fixing post and a second end part for fitting with the neck recess. The first elongated hole extends from the first end part to the second end part in a way of allowing the frame member being moved along a direction before the second end part fitting with neck recess.

12 Claims, 5 Drawing Sheets

US 7,440,284 B1

HOLDING DEVICE FOR A HEAT SINK

BACKGROUND OF THE INVENTION

1. Field of the Invention

The present invention is related to a holding device for a heat sink and particularly to a holding device capable of being detachably joined to a heat sink conveniently, saving material and suitable for heat sinks in different configuration.

2. Brief Description of the Related Art

Heat dissipation for a central processing unit (CPU) is kept as an important research subject along with electronic technology development. There are a variety of heat sinks available for different CPU's. The computer technique is getting to become a common sense to the consumers and a trend to set up a computer is getting popular such that a holding device capable of enhancing heat dissipation effect of a heat sink and being operated conveniently is one of hot products at the present time.

Taiwan Utility Model No. M253204 entitled "ENGAGING DEVICE FOR A HEAT SINK" discloses a back plate and a plurality of engaging pieces to attach a heat sink to a circuit board and contact with a heat generating electronic component. The back plate has a plurality of posts extending upward from the plate and each post has an annular recess near the upper end thereof. Each engaging piece forms a holding part at an edge thereof extending to another edge from the middle thereof to constitute an elastic piece. The elastic piece has an elongated groove at the center thereof. The posts pass through a circuit board and the heat sink in a way of the annular groove fitting with the elongated groove such that the heat sink is held.

However, the base of the preceding engaging device has a constant elevation difference from the back plate so that it is suitable for one or two sizes of circuit board only. As a result, many different types engaging devices have to be fabricated individually with a lot of cost for making a specific die respectively. Further, in case of errors being produced during manufacturing process, the heat sink is not held firmly to degrade the heat dissipation effect. In addition, the preceding engaging device has lots of engaging parts and it is a very tedious work while the users set up the heat sink.

SUMMARY OF THE INVENTION

In order to overcome the preceding problems, an object of the present invention is to provide a holding device, which is capable of being set up easily, performing firm engagement and suitable for circuit boards in different thickness, such that production cost can be lowered tremendously.

Accordingly, a holding device for a heat sink being attached to a circuit board according to the present invention includes a back plate and a frame member. The back plate provides a plurality of fixing posts with a free end of the respective fixing post having a neck recess piecing the circuit board and each of the fixing posts being surrounded with a spring. The frame member provides a plurality of corners with a support leg extending vertically from the corners and a first flat fixing ear extending horizontally from the corners, respectively. The first fixing ear has a first elongated hole with a first end part for being pierced by the fixing post and a second end part for fitting with the neck recess. The first elongated hole extends from the first end part to the second end part in a way of allowing the frame member being moved along a direction before the second end part fitting with neck recess.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
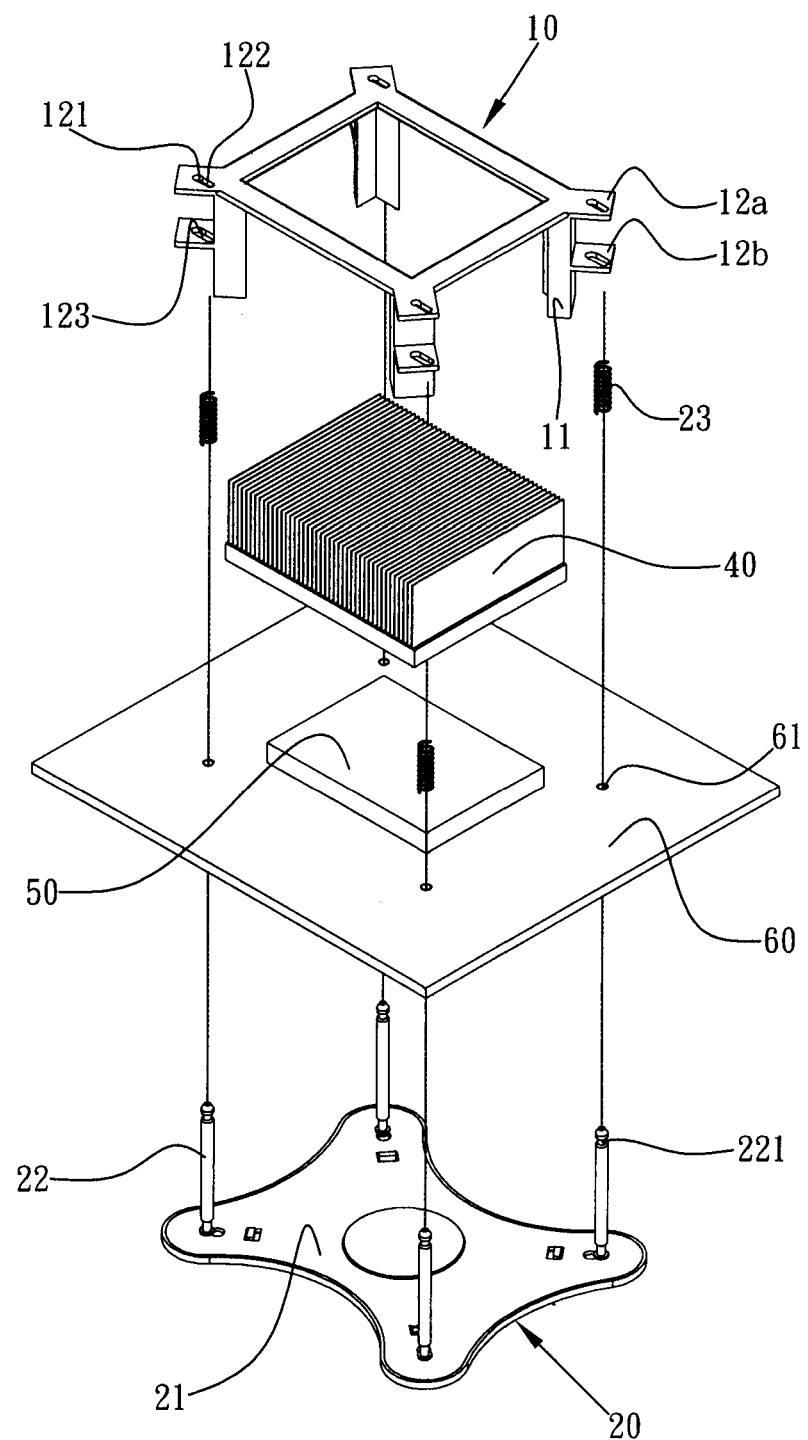
FIG. 1 is a disassembled perspective view of a preferred embodiment of a holding device for a heat sink the conventional support device according to the present invention.
Figure 2:
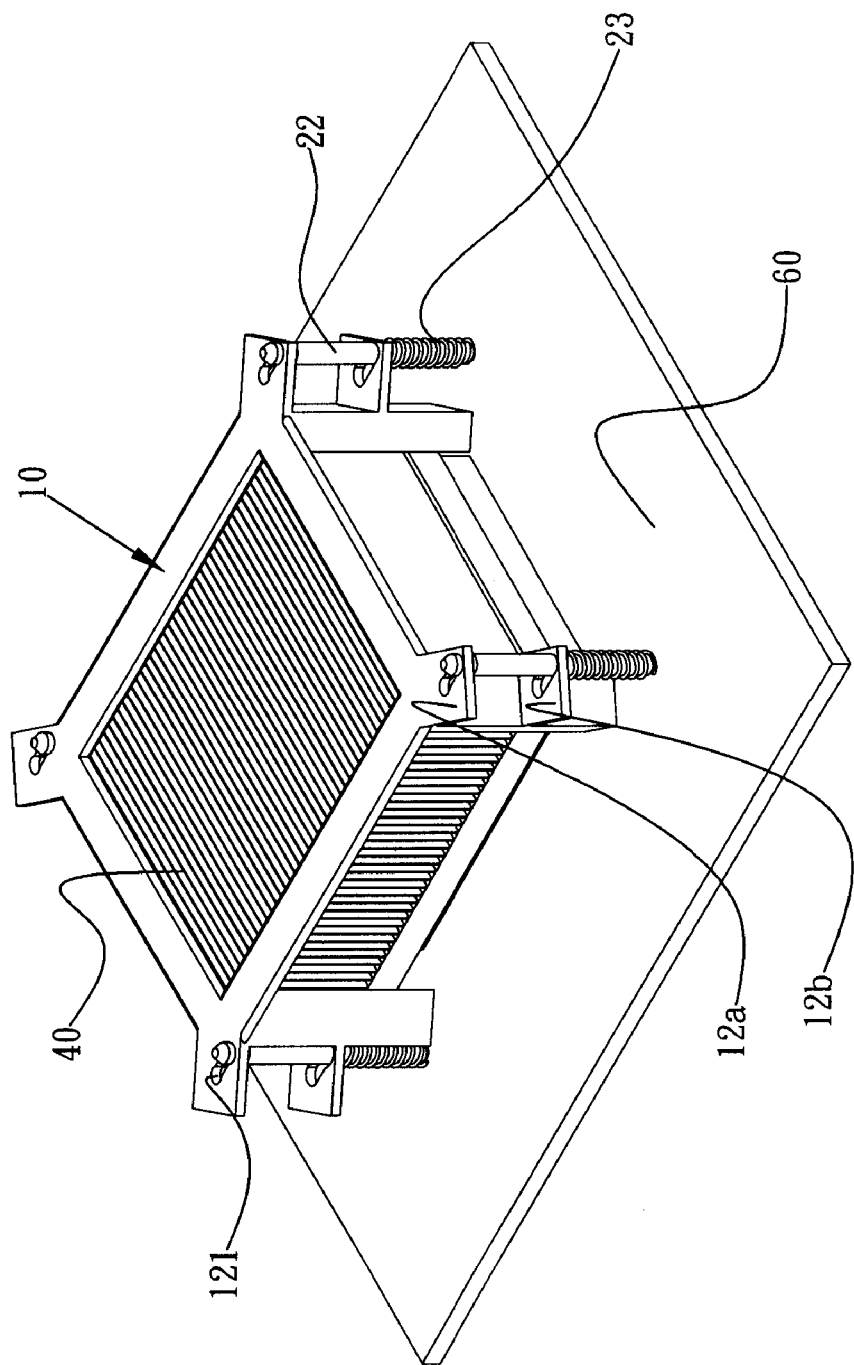
FIG. 2 is an assembled perspective view of FIG. 1.
Figure 3:
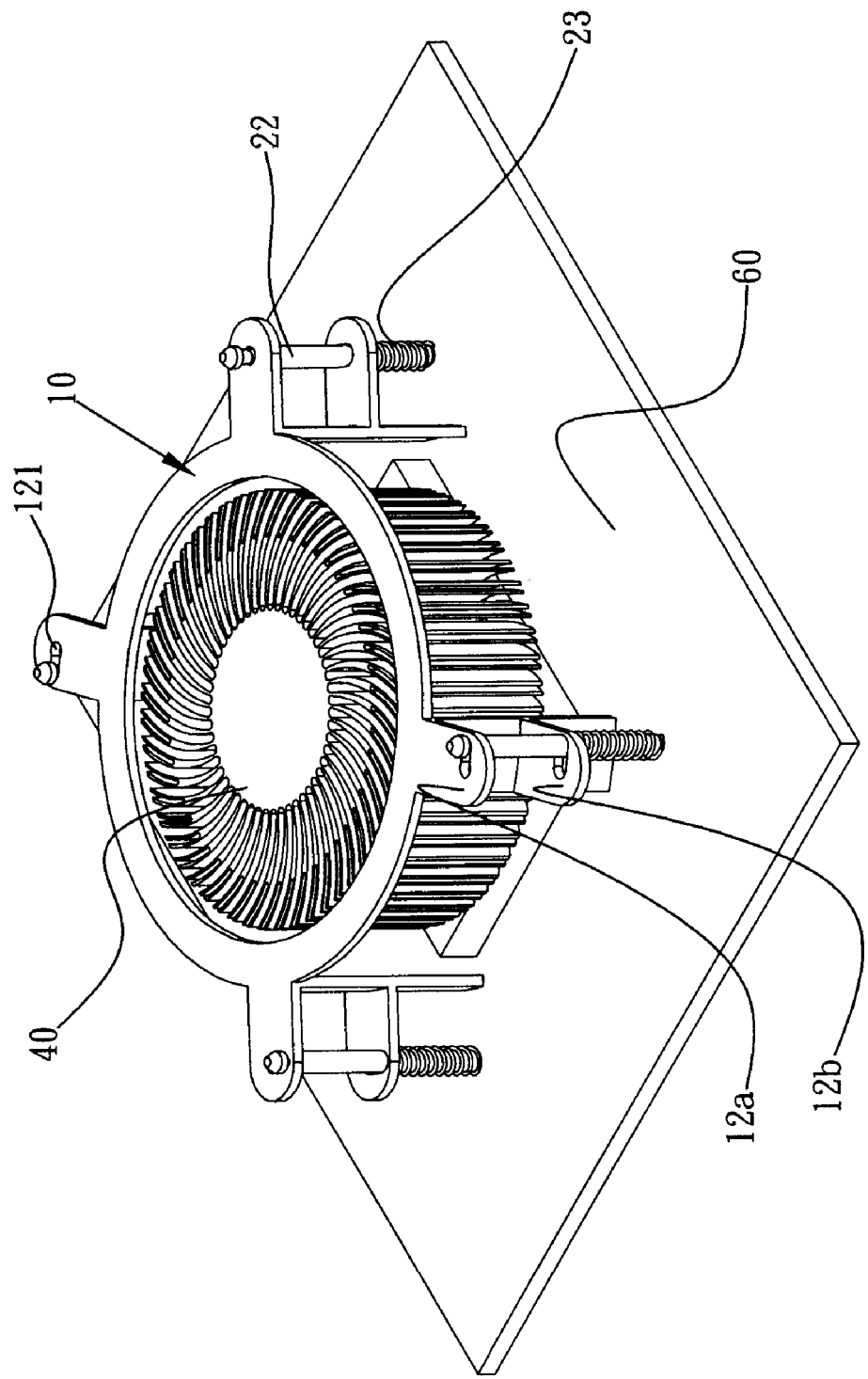
FIG. 3 is an assembled perspective view of a holding device for a heat sink according to the present invention with a circular heat sink.

Referring to FIGS. 1-2, a holding device for a heat sink according to the present invention includes a frame member 10, a heat sink 40, a circuit board 60 and a back plate 20. The circuit board 60 has a heat generating electronic component 50 and four fitting holes 61. The frame 10 is in association with the back plate 20 to hold the heat sink 40 to the circuit board 60 such that the heat sink 40 keeps contact with the electronic component 50 tightly to help heat generated from the electronic component 50 being dissipated. The heat sink 40 can be a shape of square, a circle (shown in FIG. 3), a polygon or any other geometry and the frame member 10 is provided a configuration to comply with the different shapes of heat sink 40 respectively.

The back plate 20 provides a plate member 21 with four sides thereof concave inward and four extending outward corners and a fixing post 22 extends upward from the four corners respectively corresponding to the fitting holes 61 with the free end of the fixing post 22 providing a neck recess 221 and a spring 23 being arranged to surround the fixing post 22.

The frame member 10 provides a support leg 11 extending vertically from four corners thereof respectively and provides a first flat fixing ear 12a horizontally extending outward from the four corners thereof respectively. A second flat fixing ear 12b vertically extends outward from the four support legs to be near and corresponding to the first fixing ear 12a respectively. The first fixing ear 12a has an elongated hole with a large circular end part 121 extending to a second circular end part 122 toward a corner of the first fixing ear 12a such that the large circular end part 121 is passed through with the respective fixing post 22 and the small circular end part 122 fitting with the neck recess 122. The second fixing ear 12b has an elongated locating hole 123 corresponding to the elongated hole of the first fixing ear 12a for being pierced by the fixing post 22. Hence, when the frame 10 is attached to the heat sink 40, the fixing post 22 pierces the second fixing ear 12b, the first fixing ear 12a respectively and the second fixing ear 12b exerts a pressing force to the spring 23. Under this circumference, the spring 23 is disposed between the circuit board 60 and the second fixing ear 12b in a way of being compressed and the second hole end part 122 is in a position corresponding to the neck recess 211 such that the frame member 10 moves to a position that the neck recess 221 of the free end of the fixing post 22 fitting with the small circular end part 122. In the meantime, the spring 23 provides an elastic tension against the circuit board 60 and the frame member 10 is capable of engaging with the circuit board 60 firmly.

Figure 4:
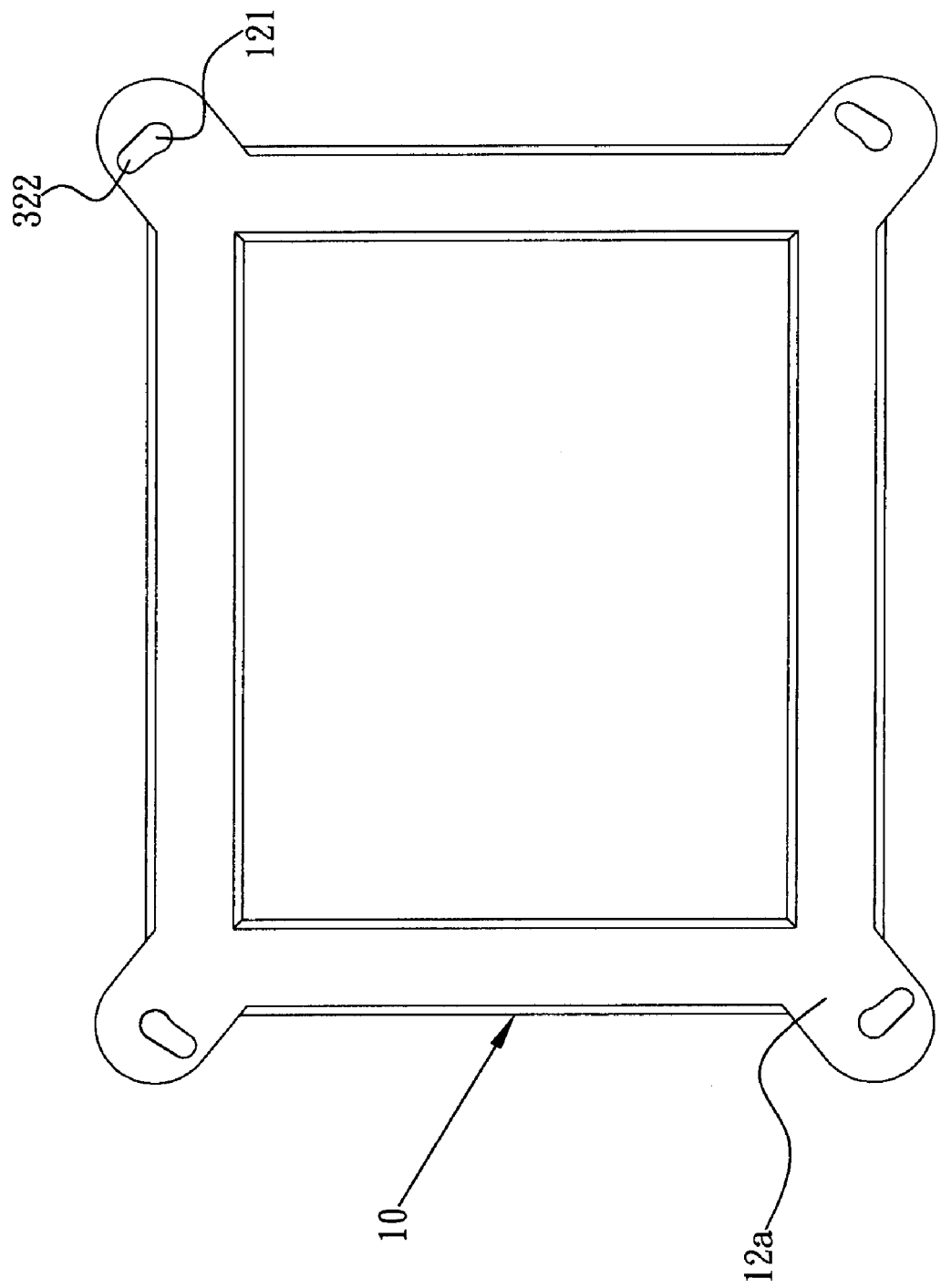
FIG. 4 is a plan view of the frame shown in FIGS. 1 and 2 illustrating the fitting holes provided with another shapes instead.

Referring to FIG. 4, the elongated hole of the first fixing ear 12a provides a second end part 322 extending from the first end part 121 along a direction perpendicular to a lateral side of the first fixing ear 12a instead of extending toward a corner of the first fixing ear 12a. The elongated hole of the second fixing ear 12b is provided to extend toward the same direction as the second end part 322. In this way, the frame member 10 is rotationally joined to the fixing post 22 so as to hold the circuit board 60.

Figure 5:
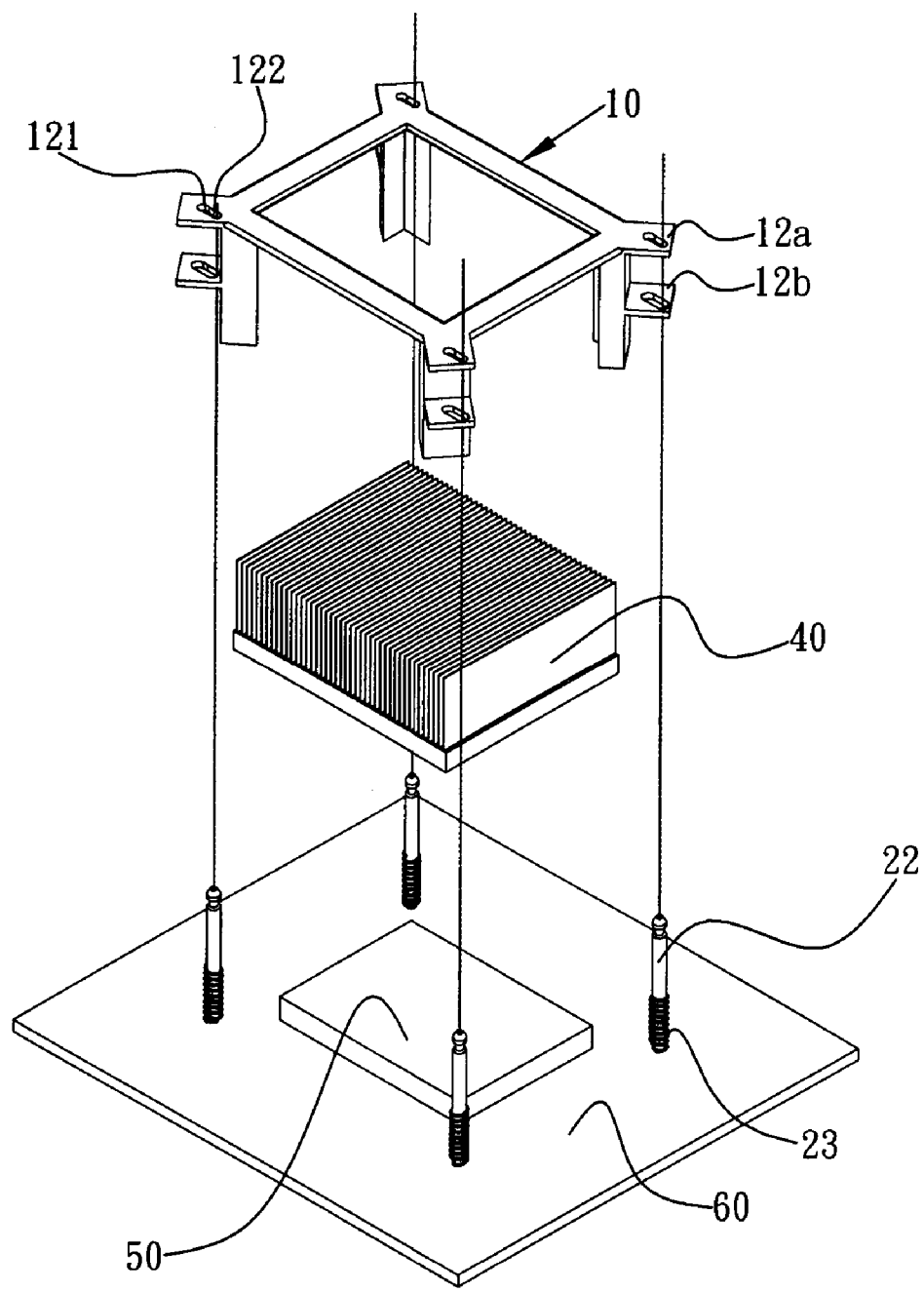
FIG. 5 is a disassembled perspective view similar to FIG. 1 illustrating the fixing posts being provided on the circuit board.

Referring to FIG. 5, another embodiment of the present invention provides the fixing post 22 is joined to the circuit board with an end thereof directly instead of engaging with the plate member 21.

While the invention has been described with referencing to preferred embodiments thereof, it is to be understood that modifications or variations may be easily made without departing from the spirit of this invention, which is defined by the appended claims.

What is claimed is:

1. A holding device for a heat sink being attached to a circuit board comprising:
    a back plate providing a plurality of fixing posts with a free end of the respective fixing posts having a neck recess piecing the circuit board and each of the fixing posts being surrounded with a spring; and
    a frame member providing a plurality of corners with a support leg vertically extending from the corners respectively and a first flat fixing ear horizontally extending outward from the corners respectively, the first fixing ear having a first elongated hole with a first end part for being pierced by a respective fixing post and a second end part for fitting with the neck recess and the first elongated hole extending from the first end part to the second end part in a way of allowing the frame member to be moved along a direction before the second end part fits with neck recess.

2. The holding device as defined in claim 1, wherein a second flat fixing ear with a second elongated hole extends outward from the support legs corresponding to the first fixing ear for being pieced with a respective fixing post.

3. The holding device as defined in claim 1, wherein the frame provides a configuration to comply with what shape of the heat sink.

4. The holding device as defined in claim 1, wherein a neck recess has a diameter smaller than that of the respective fixing post.

5. The holding device as defined in claim 1, wherein the spring is compression spring.

6. The holding device as defined in claim 1, wherein the elongated holes extend a direction toward a corner of the fixing ears respectively or toward a lateral side of the fixing ears respectively.

7. A holding device for a heat sink being attached to a circuit board comprising:
    a plurality of fixing posts extends from the circuit board with a free end of the respective fixing posts having a neck recess and each of the fixing posts being surrounded with a spring; and
    a frame member providing a plurality of corners with a support leg extending from the corners respectively, extending outward a first flat fixing ear from the corners respectively, the first fixing ear having a first elongated hole with a first end part for being pierced by the respective fixing post and a second end part for fitting with the neck recess and the first elongated hole extending from the first end part to the second end part in a way of allowing the frame member to be moved along a direction before the second end part fits with neck recess.

8. The holding device as defined in claim 7, wherein a second flat fixing ear with a second elongated hole extends outward from the support legs corresponding to the first fixing ear for being pieced with a respective fixing post.

9. The holding device as defined in claim 7, wherein the frame provides a configuration to comply with what shape of the heat sink.

10. The holding device as defined in claim 7, wherein the neck recess has a diameter smaller than that of a respective fixing post.

11. The holding device as defined in claim 7, wherein the spring is compression spring.

12. The holding device as defined in claim 7, wherein the elongated holes extend a direction toward a corner of the fixing ears respectively or perpendicular to a lateral side of the fixing ears respectively.

* * * * *